(12) United States Patent
Chen et al.

(10) Patent No.: US 8,514,605 B2
(45) Date of Patent: *Aug. 20, 2013

(54) MRAM DIODE ARRAY AND ACCESS METHOD

(75) Inventors: Yiran Chen, Eden Prairie, MN (US); Hai Li, Eden Prairie, MN (US); Hongyue Liu, Maple Grove, MN (US); Yong Lu, Rosemount, MN (US); Song S. Xue, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/611,225

(22) Filed: Sep. 12, 2012

(65) Prior Publication Data

US 2013/0003448 A1 Jan. 3, 2013

Related U.S. Application Data

(63) Continuation of application No. 12/948,824, filed on Nov. 18, 2010, now Pat. No. 8,289,746, which is a continuation of application No. 12/254,414, filed on Oct. 20, 2008, now Pat. No. 7,936,580.

(51) Int. Cl.
*G11C 5/08* (2006.01)
*G11C 27/00* (2006.01)
*G11C 11/00* (2006.01)

(52) U.S. Cl.
USPC ............ 365/66; 365/48; 365/158; 365/171; 365/173

(58) Field of Classification Search
USPC .................. 365/48, 66, 158, 171, 173
See application file for complete search history.

(56) References Cited

U.S. PATENT DOCUMENTS

| | | | |
|---|---|---|---|
| 3,746,945 | A | 7/1973 | Normington |
| 3,982,233 | A | 9/1976 | Crookshanks |

(Continued)

FOREIGN PATENT DOCUMENTS

| | | |
|---|---|---|
| DE | 102008026432 | 12/2009 |
| EP | 1329895 | 7/2003 |

(Continued)

OTHER PUBLICATIONS

Adee, S., "Quantum Tunneling Creates Fast Lane for Wireless", IEEE Spectrum, Oct. 2007.

(Continued)

*Primary Examiner* — Ly D Pham
(74) *Attorney, Agent, or Firm* — Mueting Raasch & Gebhardt PA

(57) ABSTRACT

A memory unit includes a magnetic tunnel junction data cell is electrically coupled to a bit line and a source line. The magnetic tunnel junction data cell is configured to switch between a high resistance state and a low resistance state by passing a write current through the magnetic tunnel junction data cell. A first diode is electrically between the magnetic tunnel junction data cell and the source line and a second diode is electrically between the magnetic tunnel junction data cell and the source line. The first diode and second diode are in parallel electrical connection, and having opposing forward bias directions. The memory unit is configured to be precharged to a specified precharge voltage level and the precharge voltage is less than a threshold voltage of the first diode and second diode.

20 Claims, 5 Drawing Sheets

(56) References Cited

U.S. PATENT DOCUMENTS

| | | |
|---|---|---|
| 3,982,235 A | 9/1976 | Bennett |
| 4,160,988 A | 7/1979 | Russell |
| 4,232,057 A | 11/1980 | Ray |
| 4,247,915 A | 1/1981 | Bartlett |
| 4,323,589 A | 4/1982 | Ray |
| 4,576,829 A | 3/1986 | Kaganowicz |
| 4,901,132 A | 2/1990 | Kawano |
| 5,083,190 A | 1/1992 | Pfiester |
| 5,135,878 A | 8/1992 | Bartur |
| 5,278,636 A | 1/1994 | Williams |
| 5,330,935 A | 7/1994 | Dobuzinsky |
| 5,341,114 A | 8/1994 | Calviello |
| 5,365,083 A | 11/1994 | Tada |
| 5,412,246 A | 5/1995 | Dobuzinsky |
| 5,443,863 A | 8/1995 | Neely |
| 5,580,804 A | 12/1996 | Joh |
| 5,614,430 A | 3/1997 | Liang |
| 5,739,564 A | 4/1998 | Kosa |
| 5,872,052 A | 2/1999 | Iyer |
| 5,913,149 A | 6/1999 | Thakur |
| 5,923,948 A | 7/1999 | Cathey, Jr. |
| 5,926,412 A | 7/1999 | Evans |
| 5,929,477 A | 7/1999 | McAllister |
| 6,011,281 A | 1/2000 | Nunokawa |
| 6,013,548 A | 1/2000 | Burns |
| 6,034,389 A | 3/2000 | Burns |
| 6,077,745 A | 6/2000 | Burns |
| 6,100,166 A | 8/2000 | Sakaguchi |
| 6,114,211 A | 9/2000 | Fulford |
| 6,121,642 A | 9/2000 | Newns |
| 6,121,654 A | 9/2000 | Likharev |
| 6,165,834 A | 12/2000 | Agarwal |
| 6,300,205 B1 | 10/2001 | Fulford |
| 6,341,085 B1 | 1/2002 | Yamagami |
| 6,346,477 B1 | 2/2002 | Koloyeros |
| 6,376,332 B1 | 4/2002 | Yankagita |
| 6,448,840 B2 | 9/2002 | Kao |
| 6,534,382 B1 | 3/2003 | Sakaguchi |
| 6,617,642 B1 | 9/2003 | Georgesca |
| 6,624,463 B2 | 9/2003 | Kim |
| 6,627,967 B2 | 9/2003 | Asano |
| 6,653,704 B1 | 11/2003 | Gurney |
| 6,667,900 B2 | 12/2003 | Lowrey |
| 6,750,540 B2 | 6/2004 | Kim |
| 6,753,561 B1 | 6/2004 | Rinerson et al. |
| 6,757,842 B2 | 6/2004 | Harari |
| 6,781,176 B2 | 8/2004 | Ramesh |
| 6,789,689 B1 | 9/2004 | Beale |
| 6,800,897 B2 | 10/2004 | Baliga |
| 6,842,368 B2 | 1/2005 | Hayakawa |
| 6,917,539 B2 | 7/2005 | Rinerson |
| 6,940,742 B2 | 9/2005 | Yamamura |
| 6,944,052 B2 | 9/2005 | Subramanian |
| 6,979,863 B2 | 12/2005 | Ryu |
| 7,009,877 B1 | 3/2006 | Huai |
| 7,045,840 B2 | 5/2006 | Tamai |
| 7,051,941 B2 | 5/2006 | Yui |
| 7,052,941 B2 | 5/2006 | Lee |
| 7,098,494 B2 | 8/2006 | Pakala |
| 7,130,209 B2 | 10/2006 | Reggiori |
| 7,161,861 B2 | 1/2007 | Gogl |
| 7,180,140 B1 | 2/2007 | Brisbin |
| 7,187,577 B1 | 3/2007 | Wang |
| 7,190,616 B2 | 3/2007 | Forbes |
| 7,200,036 B2 | 4/2007 | Bessho |
| 7,215,568 B2 | 5/2007 | Liaw |
| 7,218,550 B2 | 5/2007 | Schwabe |
| 7,224,601 B2 | 5/2007 | Panchula |
| 7,233,537 B2 | 6/2007 | Tanizaki |
| 7,236,394 B2 | 6/2007 | Chen |
| 7,247,570 B2 | 7/2007 | Thomas |
| 7,272,034 B1 | 9/2007 | Chen |
| 7,272,035 B1 | 9/2007 | Chen |
| 7,273,638 B2 | 9/2007 | Belyansky |
| 7,274,067 B2 | 9/2007 | Forbes |
| 7,282,755 B2 | 10/2007 | Pakala |
| 7,285,812 B2 | 10/2007 | Tang |
| 7,286,395 B2 | 10/2007 | Chen |
| 7,289,356 B2 | 10/2007 | Diao |
| 7,345,912 B2 | 3/2008 | Luo |
| 7,362,618 B2 | 4/2008 | Harari |
| 7,378,702 B2 | 5/2008 | Lee |
| 7,379,327 B2 | 5/2008 | Chen |
| 7,381,595 B2 | 6/2008 | Joshi |
| 7,382,024 B2 | 6/2008 | Ito et al. |
| 7,397,713 B2 | 7/2008 | Harari |
| 7,413,480 B2 | 8/2008 | Thomas |
| 7,414,908 B2 | 8/2008 | Miyatake |
| 7,416,929 B2 | 8/2008 | Mazzola |
| 7,432,574 B2 | 10/2008 | Nakamura |
| 7,440,317 B2 | 10/2008 | Bhattacharyya |
| 7,465,983 B2 | 12/2008 | Eldridge |
| 7,470,142 B2 | 12/2008 | Lee |
| 7,470,598 B2 | 12/2008 | Lee |
| 7,502,249 B1 | 3/2009 | Ding |
| 7,515,457 B2 | 4/2009 | Chen |
| 7,542,356 B2 | 6/2009 | Lee |
| 7,646,629 B2 | 1/2010 | Hamberg |
| 7,697,322 B2 | 4/2010 | Leuschner |
| 7,738,279 B2 | 6/2010 | Siesazeck |
| 7,738,881 B2 | 6/2010 | Krumm |
| 8,289,746 B2 * | 10/2012 | Chen et al. .................. 365/66 |
| 2001/0046154 A1 | 11/2001 | Forbes |
| 2002/0081822 A1 | 6/2002 | Yanageta |
| 2002/0136047 A1 | 9/2002 | Scheuerlein |
| 2003/0168684 A1 | 9/2003 | Pan |
| 2004/0084725 A1 | 5/2004 | Nishiwaki |
| 2004/0114413 A1 | 6/2004 | Parkinson |
| 2004/0114438 A1 | 6/2004 | Morimoto |
| 2004/0257878 A1 | 12/2004 | Morikawa |
| 2004/0262635 A1 | 12/2004 | Lee |
| 2005/0044703 A1 | 3/2005 | Liu |
| 2005/0092526 A1 | 5/2005 | Fielder |
| 2005/0122768 A1 | 6/2005 | Fukumoto |
| 2005/0145947 A1 | 7/2005 | Russ et al. |
| 2005/0218521 A1 | 10/2005 | Lee |
| 2005/0253143 A1 | 11/2005 | Takaura |
| 2005/0280042 A1 | 12/2005 | Lee |
| 2005/0280061 A1 | 12/2005 | Lee |
| 2005/0280154 A1 | 12/2005 | Lee |
| 2005/0280155 A1 | 12/2005 | Lee |
| 2005/0280156 A1 | 12/2005 | Lee |
| 2005/0282356 A1 | 12/2005 | Lee |
| 2006/0073652 A1 | 4/2006 | Pellizzer |
| 2006/0076548 A1 | 4/2006 | Park |
| 2006/0131554 A1 | 6/2006 | Joung |
| 2006/0275962 A1 | 12/2006 | Lee |
| 2007/0007536 A1 | 1/2007 | Hidaka |
| 2007/0077694 A1 | 4/2007 | Lee |
| 2007/0105241 A1 | 5/2007 | Leuschner |
| 2007/0113884 A1 | 5/2007 | Kensey |
| 2007/0115749 A1 | 5/2007 | Gilbert |
| 2007/0253245 A1 | 11/2007 | Ranjan |
| 2007/0279968 A1 | 12/2007 | Luo |
| 2007/0281439 A1 | 12/2007 | Bedell |
| 2007/0297223 A1 | 12/2007 | Chen |
| 2008/0007993 A1 | 1/2008 | Saitoh |
| 2008/0025083 A1 | 1/2008 | Okhonin |
| 2008/0029782 A1 | 2/2008 | Carpenter |
| 2008/0032463 A1 | 2/2008 | Lee |
| 2008/0037314 A1 | 2/2008 | Ueda |
| 2008/0038902 A1 | 2/2008 | Lee |
| 2008/0048327 A1 | 2/2008 | Lee |
| 2008/0094873 A1 | 4/2008 | Lai |
| 2008/0108212 A1 | 5/2008 | Moss |
| 2008/0144355 A1 | 6/2008 | Boeve |
| 2008/0170432 A1 | 7/2008 | Asao |
| 2008/0180989 A1 | 7/2008 | Baek |
| 2008/0191312 A1 | 8/2008 | Oh |
| 2008/0261380 A1 | 10/2008 | Lee |
| 2008/0265360 A1 | 10/2008 | Lee |
| 2008/0273380 A1 | 11/2008 | Diao |
| 2008/0310213 A1 | 12/2008 | Chen |
| 2008/0310219 A1 | 12/2008 | Chen |

| | | | |
|---|---|---|---|
| 2009/0014719 A1 | 1/2009 | Shimizu | |
| 2009/0040855 A1 | 2/2009 | Luo | |
| 2009/0052225 A1 | 2/2009 | Morimoto | |
| 2009/0072246 A1 | 3/2009 | Genrikh | |
| 2009/0072279 A1 | 3/2009 | Moselund | |
| 2009/0161408 A1 | 6/2009 | Tanigami | |
| 2009/0162979 A1 | 6/2009 | Yang | |
| 2009/0168493 A1 | 7/2009 | Kim | |
| 2009/0185410 A1 | 7/2009 | Huai | |
| 2009/0296449 A1 | 12/2009 | Slesazeck | |
| 2010/0007344 A1 | 1/2010 | Guo | |
| 2010/0067281 A1 | 3/2010 | Xi | |
| 2010/0078620 A1 | 4/2010 | Xi et al. | |
| 2010/0110756 A1 | 5/2010 | Khoury | |
| 2010/0142256 A1 | 6/2010 | Kumar | |
| 2010/0149856 A1 | 6/2010 | Tang | |

FOREIGN PATENT DOCUMENTS

| | | |
|---|---|---|
| WO | WO 0062346 | 10/2000 |
| WO | WO 0215277 | 2/2002 |
| WO | WO 2005/124787 | 12/2005 |
| WO | WO 2006/100657 | 9/2006 |
| WO | WO 2007/100626 | 9/2007 |
| WO | WO 2007/128738 | 11/2007 |

OTHER PUBLICATIONS

Berger et al., Merged-Transitor Logic (MTL)—A Low-Cost Bipolar Logic Concept, Solid-State Circuits, IEEE Journal, vol. 7, Issue 5, pp. 340-346 (2003).

Giacomini, R., et al., Modeling Silicon on Insulator MOS Transistors with Nonrectangular-Gate Layouts, Journal of the Electrochemical Society, 2006, pp. G218-G222, vol. 153, No. 3.

Hwang et al., Degradation of MOSFET's Drive Current Due to Halo Ion Implantation, Electron Devices Meeting, 1996, International Date: Dec. 8-11, 1996, pp. 567-570.

Internet website www.en.wikipedia.org/wiki/High-k dated Nov. 12, 2008.

Likharev, K., "Layered tunnel barrier for nonvolatile memory devices", Applied Physics Letters vol. 73, No. 15; Oct. 12, 1998.

Londergran et al., Interlayer Mediated Epitaxy of Cobalt Silicide on Silicon (100) from Low Temperature Chemical Vapor Deposition of Cobalt, Journal of the Electrochemical Society, 148 (1) C21-C27 (2001) C21.

PCT/ISA/210 Int'l. Search Report and PCT/ISA/237 Written Opinion for PCT/US2010/041134 from the EPO.

Romanyuk, A., et al., Temperature-induced metal-semiconductor transition in W-doped VO2 films studied by photoelectron spectroscopy, Solar Energy Materials and Solar Cells, 2007, pp. 1831-1835, No. 91, Elsevier, Switzerland.

Sayan, S., "Valence and conduction band offsets of a $ZrO_2/SiO_xN_y$/n-Si CMOS gate stack: A combined photoemission and inverse photoemission study", Phys. Stat. Sol. (b) 241, No. 10, pp. 2246-2252 (2004).

Takato et al., High Performance CMOS Surrounding Gate Transistor (SGT) for Ultra High Density LSIs, Downloaded on Apr. 14, 2009 from IEEE Xplore, pp. 222-225.

U.S. Appl. No. 12/175,545, filed Jul. 18, 2008, Inventors: Lou et al.
U.S. Appl. No. 12/120,715, filed May 15, 2008, Inventors: Tian et al.
U.S. Appl. No. 12/498,661, filed Jul. 7, 2009, Inventor: Khoury.
U.S. Appl. No. 12/502,211, filed Jul. 13, 2009, Inventor: Lu.

Wang et al., Precision Control of Halo Implantation for Scaling-down ULSI Manufacturing, IEEE International Symposium on Sep. 13-15, 2005, pp. 204-207.

Zahler, James, et al., Wafer Bonding and Layer Transfer Processes for High Efficiency Solar Cells, NCPV and Solar Program Review Meeting, pp. 723-726, 2003.

Chung et al., A New SOI Inverter for Low Power Applications, Proceedings 1996 IEEE International SOI Conference, Oct. 1996.

Hosomi et al., A Novel Nonvolatile Memory with Spin Torque Transfer Magnetization Switching: Spin-RAM, 2005 IEEE.

* cited by examiner

MRAM DIODE ARRAY AND ACCESS METHOD

CROSS-REFERENCE

This application is a continuation application of application Ser. No. 12/948,824 FILED Nov. 18, 2010 which is a continuation of application Ser. No. 12/254,414, filed Oct. 20, 2008, now U.S. Pat. No. 7,936,580, and titled "MRAM Diode Array and Access Method." The entire disclosures of which are incorporated herein by reference.

BACKGROUND

Fast growth of the computing and handheld/communication industry has generated exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One challenge is that the transistor utilized to provide the write switching current is sized to accommodate the larger switching current and this increase in size limits the scaling of the memory devices.

BRIEF SUMMARY

The present disclosure relates to MRAM memory. In particular, present disclosure relates to a spin-transfer torque memory that includes parallel and opposing diodes to assist in resistance state switching and method of writing and reading the spin-transfer torque memory.

One illustrative memory unit includes a magnetic tunnel junction data cell electrically coupled to a bit line and a source line. The magnetic tunnel junction data cell is configured to switch between a high resistance state and a low resistance state by passing a write current through the magnetic tunnel junction data cell. A first diode is electrically between the magnetic tunnel junction data cell and the source line and a second diode is electrically between the magnetic tunnel junction data cell and the source line. The first diode and second diode are in parallel electrical connection, and having opposing forward bias directions.

One illustrative method includes switching a magnetic tunnel junction data cell from a high resistance state to a low resistance state by passing a write current through the magnetic tunnel junction data cell in a first direction. The write current provided by a first diode is electrically coupled to the magnetic tunnel junction data cell and a source line. The method then includes switching the magnetic tunnel junction data cell from a low resistance state to a high resistance state by passing a write current through the magnetic tunnel junction data cell in a second direction opposing the first direction. The write current is provided by a second diode being electrically coupled to the magnetic tunnel junction data cell and a source line and in parallel electrical connection with the first diode.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to MRAM. In particular, present disclosure relates to a diode-based spin-transfer torque memory access method. The diodes provide high driving current for spin-transfer torque memory writing/reading with small area overhead and leakage power consumption. The corresponding data storage structure and the control scheme are also proposed for random data access. This construction and method provides high driving current for spin-transfer torque memory writing with small area overhead and leakage power consumption potentially. Instead of having three lines (word line, bit line and source line), only two lines are needed to select cell and write/read data to it (but two separate operations may be needed for values "0" and "1" respectively). The complexity of the corresponding control circuitry is low. While the present disclosure is not so limited, an appreciation of various aspects of the disclosure will be gained through a discussion of the examples provided below.

Figure 1:
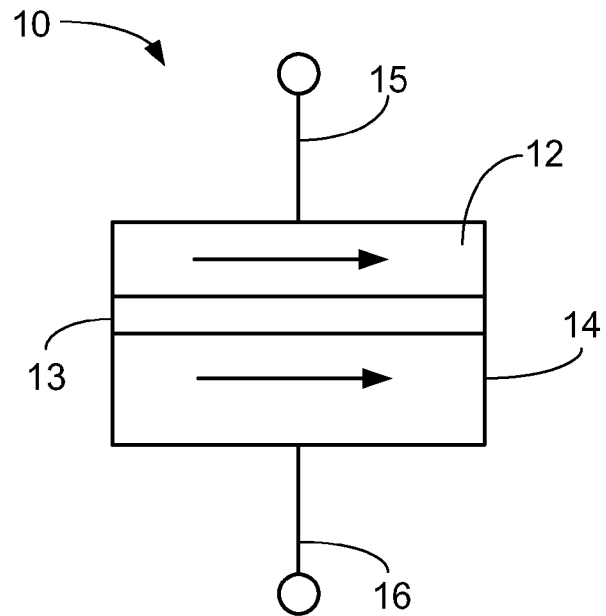
FIG. 1 is a cross-sectional schematic diagram of an illustrative magnetic tunnel junction memory cell in the low resistance state.
Figure 2:
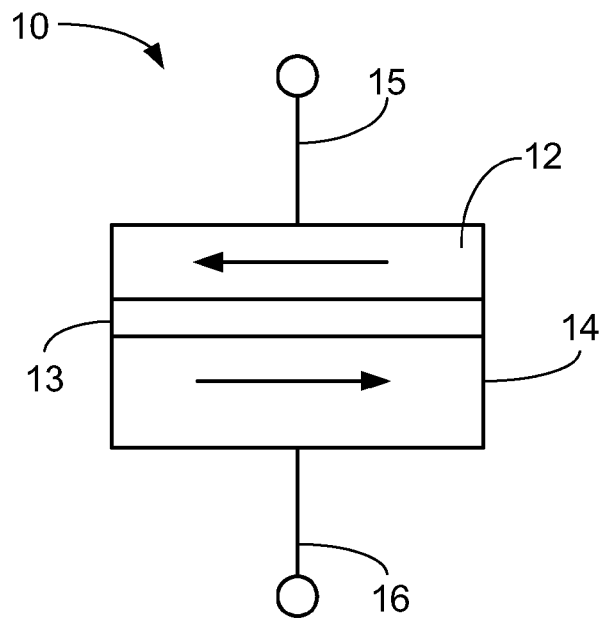
FIG. 2 is a cross-sectional schematic diagram of another magnetic tunnel junction memory cell in the high resistance state.

FIG. 1 is a cross-sectional schematic diagram of an illustrative magnetic tunnel junction data cell 10 in the low resistance state and FIG. 2 is a cross-sectional schematic diagram of another magnetic tunnel junction data cell 10 in the high resistance state. The magnetic tunnel junction data cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the magnetic tunnel junction data cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the magnetic tunnel junction data cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the magnetic tunnel junction data cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the magnetic tunnel junction data cell 10 via spin-transfer occurs when a current, passing through a magnetic layer of the magnetic tunnel junction data cell 10, becomes spin polarized and imparts a spin torque on the free layer 12 of the magnetic tunnel junction data cell 10. When a sufficient spin torque is applied to the free layer 12, the magnetization orientation of the free layer 12 can be switched between two opposite directions and accordingly the magnetic tunnel junction data cell 10 can be switched between the parallel state (i.e., low resistance state or "0" data state) and anti-parallel state (i.e., high resistance state or "1" data state) depending on the direction of the current.

The illustrative spin-transfer torque magnetic tunnel junction data cell 10 may be used to construct a memory device that includes multiple magnetic tunnel junction data cell where a data bit is stored in magnetic tunnel junction data cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque magnetic tunnel junction data cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
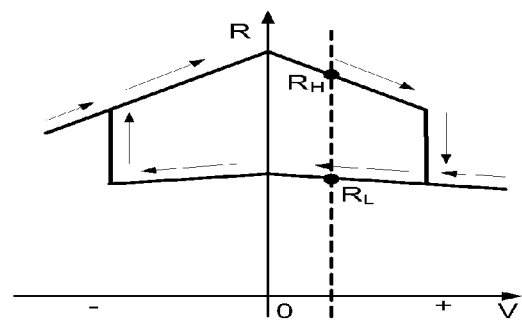
FIG. 3 is a graph of a static R-V (resistance-voltage) curve of a magnetic tunnel junction memory cell.

FIG. 3 is a graph of a static R-V sweep curve of a magnetic tunnel junction data cell. When applying a positive voltage on the second electrode 15 in FIG. 1 or 2, the MTJ 10 enters the positive applied voltage region in FIG. 3 and switches from the high resistance state (FIG. 2) to the low resistance state (FIG. 1). When applying a positive voltage on the first electrode 16 in FIG. 1 or 2, the magnetic tunnel junction data cell 10 enters the negative applied voltage region in FIG. 3. The resistance of the magnetic tunnel junction data cell switches from the low resistance state (FIG. 1) to the high resistance state (FIG. 2).

Let $R_H$ and $R_L$ denote the high and low magnet resistance, respectively. We define the Tunneling Magneto Resistance Ratio (TMR) as $TMR=(R_H-R_L)/R_L$. Here $R_H$, $R_L$ and TMR are determined by also the sensing current or voltage, as shown in FIG. 3. Generally, a large TMR makes it easier to distinguish the two resistance states of the magnetic tunnel junction data cell.

Figure 4:
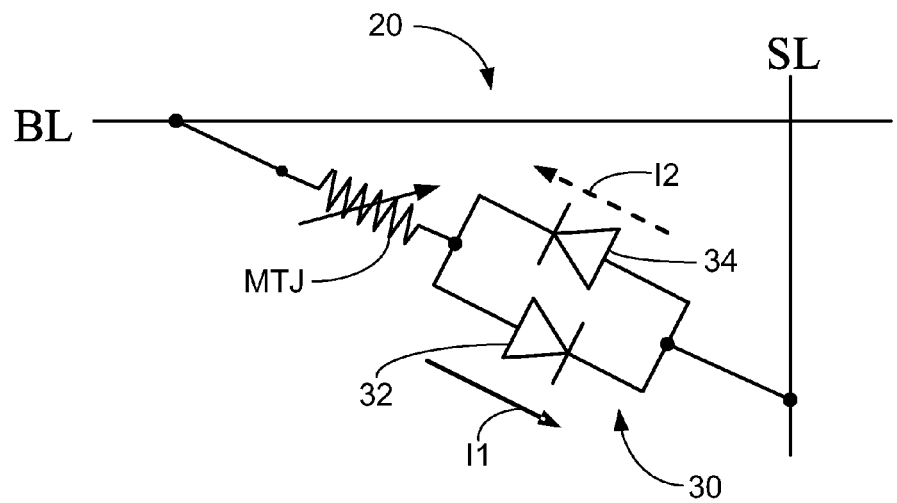
FIG. 4 is a schematic circuit diagram of a memory unit.

FIG. 4 is a schematic circuit diagram of a memory unit 20. The memory unit 20 includes a magnetic tunnel junction data cell MTJ electrically coupled to a bit line BL and a source line SL. The magnetic tunnel junction data cell MTJ is configured to switch between a high resistance state and a low resistance state by passing a write current through the magnetic tunnel junction data cell. A diode pair 30 is electrically between the MTJ and the source line SL. The diode pair 30 includes a first diode 32 in parallel electrical connection with a second diode 34. The first diode 32 and the second diode 34 have opposing forward bias directions. The first diode 32 allows current to flow in a first direction I1 and blocks or inhibits current flow in an opposing second direction. The second diode 34 allows current to flow in a second direction I2 and blocks or inhibits current flow in an opposing first direction. The diodes 32 and 34 can be any useful diode such as, for example, a p-n junction.

Thus for example, the first diode 32 can provide current to the magnetic tunnel junction data cell MTJ to switch the magnetic tunnel junction data cell MTJ from a high resistance state to a low resistance state and the second diode 34 provides current to the magnetic tunnel junction data cell MTJ to switch the magnetic tunnel junction data cell MTJ from a low resistance state to a high resistance state or vice versa.

The memory unit 20 does not include a transistor such as a NMOS transistor. Specifically the memory unit 20 does not include a transistor electrically between the bit line and the source line. Elimination of the transistor in the memory unit also eliminates a third electrical connection (e.g., word line). In addition, a NMOS (or PMOS) transistor needs to be large enough to provide the minimal driving current to the memory cell in both directions. Since the driving current across the transistor is asymmetric (current can be 4× greater than current in opposing direction), the transistor is oversized which reduces the density of a memory array utilizing the transistor design.

Figure 5:
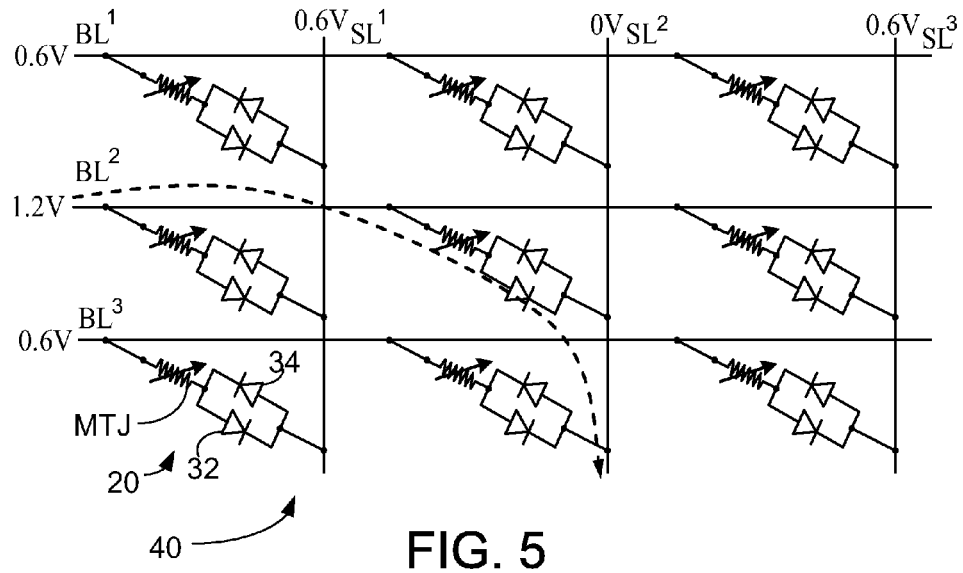
FIG. 5 is a schematic circuit diagram of writing a data state to a selected memory unit of a memory unit array.

FIG. 5 is a schematic circuit diagram of writing a data state to a selected memory unit of a memory unit array 40. The memory array 40 includes a plurality of bit lines $BL^1$, $BL^2$, $BL^3$ and a plurality of source lines $SL^1$, $SL^2$, $SL^3$ intersecting with the plurality of bit lines $BL^1$, $BL^2$, $BL^3$ and forming a cross-point array. While only three bit lines and three source lines are illustrated, it is understood that the memory unit array 40 can have any useful number of bit lines and source lines.

A memory unit 20 (as described above) is adjacent to at least selected cross-points of the cross-point array. The memory unit 20 includes a magnetic tunnel junction data cell MTJ electrically coupled to a bit line $BL^1$, $BL^2$, or $BL^3$ and a source line $SL^1$, $SL^2$, or $SL^3$. The magnetic tunnel junction data cell MTJ is configured to switch between a high resistance state and a low resistance state by passing a write current through the magnetic tunnel junction data cell, as described above.

A first diode 32 is electrically between the magnetic tunnel junction data cell MTJ and the source line ($SL^1$ for the illustrated cross-point memory unit 20). A second diode 34 is electrically between the magnetic tunnel junction data cell MTJ and the source line ($SL^1$ for the illustrated cross-point memory unit 20). The first diode 32 and the second diode 34 are in parallel electrically connection, and having opposing forward bias directions, as described above.

FIG. 5 also illustrates a writing access method. The bit lines $BL^1$, $BL^2$, $BL^3$ and the source lines $SL^1$, $SL^2$, $SL^3$ are precharged to a specified precharge voltage level. This specified precharge voltage level can be any useful level. In many embodiments, the specified precharge voltage level is in a range 40 to 60% of the write voltage level or Vdd, or about 50% of the write voltage level or Vdd. Here Vdd is set to 1.2V so the bit lines $BL^1$, $BL^2$, $BL^3$ and the source lines $SL^1$, $SL^2$, $SL^3$ are precharged to 0.6V.

Here the selected memory unit 20 to write to is located at the intersection of $BL^2$ and $SL^2$. Thus, a write voltage or Vdd of 1.2V is applied across the selected memory unit 20 in a first direction (to write a first resistance state). In this example, the 1.2 V is applied to the bit line $BL^2$ and the source line $SL^2$ is grounded. The precharge voltage is selected so that the voltage difference between any other (non-selected) two source lines or bit lines is always less than threshold voltage for the diode (in many embodiments the diode threshold voltage is greater than 0.6V for example). Therefore, current does not flow through any other diodes in the array 40. Switching the ground and Vdd provides current in a second direction (to write a second resistance state) opposing the first direction.

Figure 6:
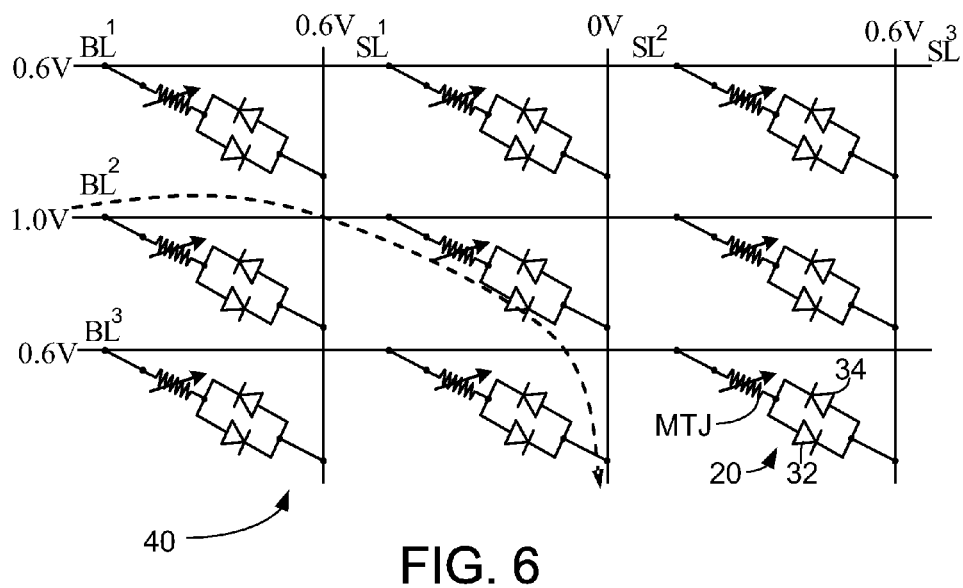
FIG. 6 is a schematic circuit diagram of reading a selected memory unit of a memory unit array.

FIG. 6 is a schematic circuit diagram of reading a selected memory unit of a memory unit array 40. The memory array 40 includes a plurality of bit lines $BL^1$, $BL^2$, $BL^3$ and a plurality of source lines $SL^1$, $SL^2$, $SL^3$ intersecting with the plurality of bit lines $BL^1$, $BL^2$, $BL^3$ and forming a cross-point array, as described above. While only three bit lines and three source lines are illustrated, it is understood that the memory unit array 40 can have any useful number of bit lines and source lines.

A memory unit 20 (as described above) is adjacent to at least selected cross-points of the cross-point array. The memory unit 20 includes a magnetic tunnel junction data cell MTJ electrically coupled to a bit line $BL^1$, $BL^2$, or $BL^3$ and a source line $SL^1$, $SL^2$, or $SL^3$. The magnetic tunnel junction data cell MTJ is configured to switch between a high resistance state and a low resistance state by passing a write current through the magnetic tunnel junction data cell, as described above.

A first diode 32 is electrically between the magnetic tunnel junction data cell MTJ and the source line ($SL^3$ for the illustrated cross-point memory unit 20). A second diode 34 is electrically between the magnetic tunnel junction data cell MTJ and the source line ($SL^3$ for the illustrated cross-point memory unit 20). The first diode 32 and the second diode 34 are in parallel electrically connection, and having opposing forward bias directions, as described above.

FIG. 6 also illustrates a reading access method. The bit lines $BL^1$, $BL^2$, $BL^3$ and the source lines $SL^1$, $SL^2$, $SL^3$ are precharged to a specified precharge voltage level. This specified precharge voltage level can be any useful level. In many embodiments, the specified precharge voltage level is in a range 40 to 60% of the write voltage level or Vdd, or about 50% of the write voltage level or Vdd. Here Vdd is set to 1.2V so the bit lines $BL^1$, $BL^2$, $BL^3$ and the source lines $SL^1$, $SL^2$, $SL^3$ are precharged to 0.6V.

Here the selected memory unit 20 to read to is located at the intersection of $BL^2$ and $SL^2$. Thus, a read voltage of 1.0V (being a level of less than the write voltage or Vdd of 1.2V) is applied across the selected memory unit 20. In this example, the 1.0 V is applied to the bit line $BL^2$ and the source line $SL^2$ is grounded. The precharge voltage is selected so that the voltage difference between any other (non-selected) two source lines or bit lines is always less than threshold voltage for the diode (in many embodiments the diode threshold voltage is greater than 0.6V for example). Therefore, current does not flow through any other diodes in the array 40.

Figure 7:
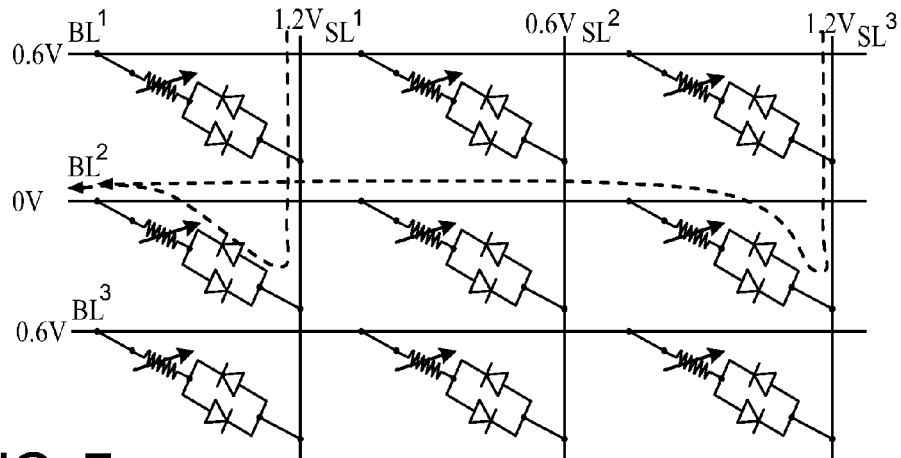
FIG. 7 is a schematic circuit diagram of writing a data state to selected memory units along a selected bit line of a memory unit array.

FIG. 7 is a schematic circuit diagram of writing a data state to selected memory units along a single row of a memory unit array 40. The memory array 40 includes a plurality of bit lines $BL^1$, $BL^2$, $BL^3$ and a plurality of source lines $SL^1$, $SL^2$, $SL^3$ intersecting with the plurality of bit lines $BL^1$, $BL^2$, $BL^3$ and forming a cross-point array. While only three bit lines and three source lines are illustrated, it is understood that the memory unit array 40 can have any useful number of bit lines and source lines.

A memory unit (as described above) is adjacent to at least selected cross-points of the cross-point array. The bit lines $BL^1$, $BL^2$, $BL^3$ and the source lines $SL^1$, $SL^2$, $SL^3$ are precharged to a specified precharge voltage level. This specified precharge voltage level can be any useful level. In many embodiments, the specified precharge voltage level is in a range 40 to 60% of the write voltage level or Vdd, or about 50% of the write voltage level or Vdd. Here Vdd is set to 1.2V so the bit lines $BL^1$, $BL^2$, $BL^3$ and the source lines $SL^1$, $SL^2$, $SL^3$ are precharged to 0.6V.

Here the selected memory units to write to are located along a single row or bit line $BL^2$ and down two source lines $SL^1$ and $SL^3$. Thus, a write voltage or Vdd of 1.2V is applied across the two selected memory units in a first direction (to write a first resistance state to all selected memory units). In this example, the bit line $BL^2$ is grounded and the source lines $SL^1$ and $SL^3$ have Vdd (1.2V) applied to them. The precharge voltage is selected so that the voltage difference between any other (non-selected) source lines or bit lines is always less than threshold voltage for the diode (in many embodiments the diode threshold voltage is greater than 0.6V for example). Therefore, current does not flow through any other diodes in the array 40. Switching the ground and Vdd provides current in a second direction (to write a second resistance state) opposing the first direction. In many of these embodiments, the first data state is written to the selected memory units along a specific bit line or source line and then the opposing data state is written to other memory units along the specific bit line or source line in a separate writing step.

Figure 8:
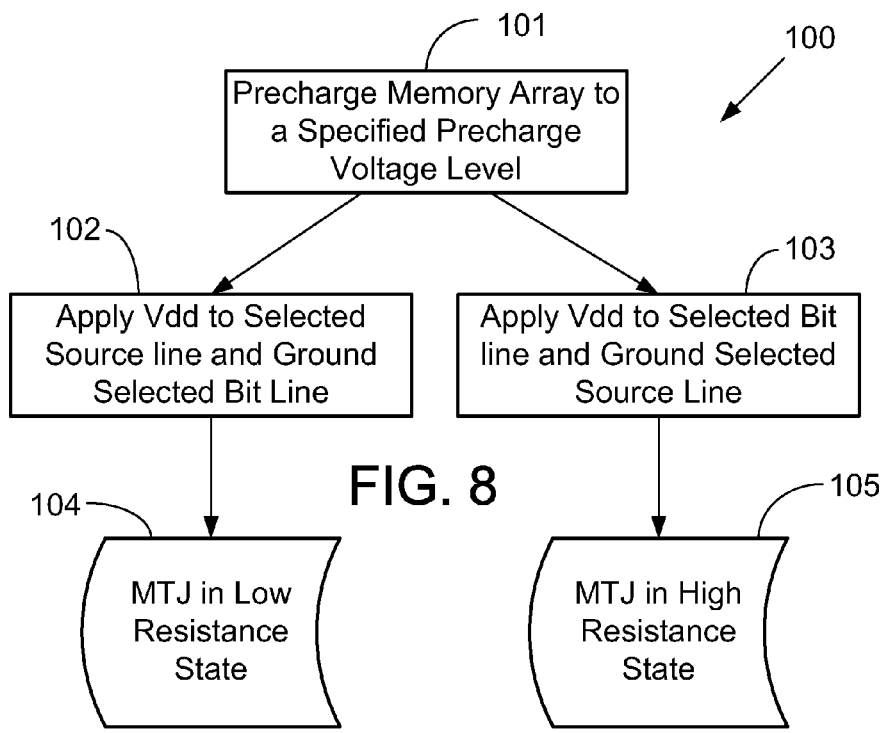
FIG. 8 is a flow diagram of an illustrative method of writing to a memory unit array.

FIG. 8 is a flow diagram of an illustrative method of writing to a memory unit array 100, described above. The method includes precharging the memory array to a specified precharge voltage level at block 101, as described above. If writing a low resistance state, then the writing voltage Vdd is applied to a selected source line and a selected bit line is grounded at block 102 to place the selected MTJ in a low resistance state at data state 104. If writing a high resistance state, then the writing voltage Vdd is applied to a selected bit line and a selected source line is grounded at block 103 to place the selected MTJ in a high resistance state at data state 105. In other embodiments, the data resistance states can be reversed based on the configuration of the MTJ.

Figure 9:
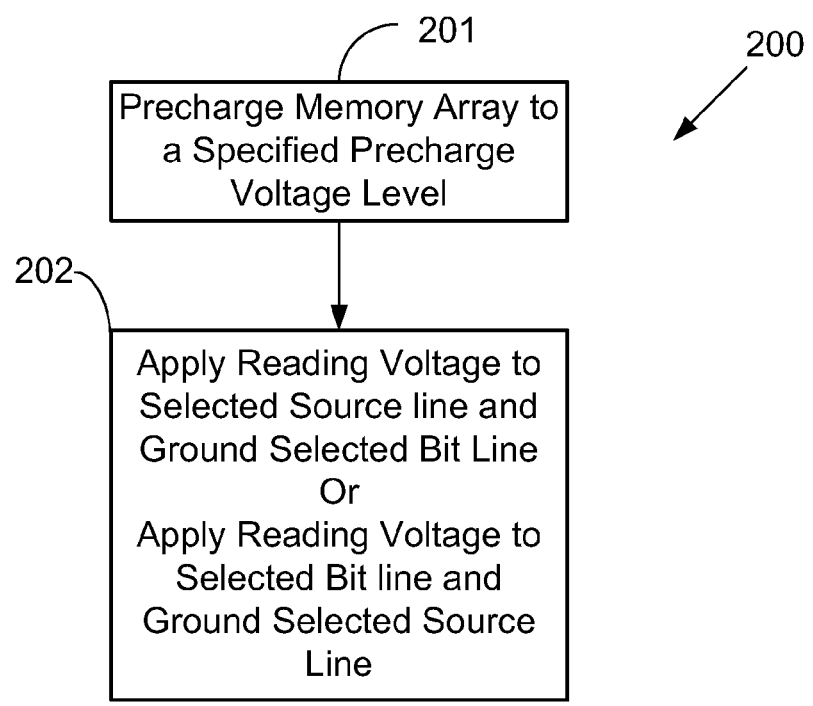
FIG. 9 is a flow diagram of an illustrative method of reading a memory unit array.

FIG. 9 is a flow diagram of an illustrative method of reading a memory unit array 200, described above. The method includes precharging the memory array to a specified precharge voltage level at block 201, as described above. Then a reading current is applied to either the selected source or bit line and the other selected source or bit line is grounded at block 202.

Thus, embodiments of the MRAM DIODE ARRAY AND ACCESS METHOD are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory unit comprising:
a magnetic tunnel junction data cell electrically coupled to a bit line and a source line, the magnetic tunnel junction data cell configured to switch between a high resistance state and a low resistance state by passing a write current through the magnetic tunnel junction data cell;
a first diode electrically between the magnetic tunnel junction data cell and the source line; and
a second diode electrically between the magnetic tunnel junction data cell and the source line, the first diode and second diode in parallel electrical connection, and having opposing forward bias directions
wherein the source line and bit line is configured to be precharged to a specified precharge voltage level, the precharge voltage being less than a threshold voltage of the first diode and second diode.

2. A memory unit according to claim 1, wherein the specified precharge voltage level is in a range from 40 to 60% of a write voltage.

3. A memory unit according to claim 1, wherein the memory unit does not include a transistor electrically between the bit line and the source line.

4. A memory unit according to claim 1, wherein the first diode provides current to the magnetic tunnel junction data cell to switch the magnetic tunnel junction data cell from a high resistance state to a low resistance state and the second diode provides current to the magnetic tunnel junction data cell to switch the magnetic tunnel junction data cell from a low resistance state to a high resistance state.

5. A memory unit according to claim 1, wherein the magnetic tunnel junction data cell is a spin-transfer torque data cell.

6. A memory unit according to claim 1, wherein the first diode is a p-n junction and the second diode is a p-n junction.

7. A memory array, comprising:
a plurality of bit lines;
a plurality of source lines intersecting with the plurality of bit lines and forming a cross-point array;
a memory unit adjacent to at least selected cross-points of the cross-point array, the memory unit comprising:
a magnetic tunnel junction data cell electrically coupled to a bit line and a source line, the magnetic tunnel junction data cell configured to switch between a high resistance state and a low resistance state by passing a write current through the magnetic tunnel junction data cell;
a first diode electrically between the magnetic tunnel junction data cell and the source line; and
a second diode electrically between the magnetic tunnel junction data cell and the source line, the first diode and second diode in parallel electrical connection, and having opposing forward bias directions;
wherein the cross-point array is configured to be precharged to a specified precharge voltage level, the precharge voltage being less than a threshold voltage of the first diode and second diode.

8. A memory array according to claim 7, wherein the specified precharge voltage level is in a range from 40 to 60% of a write voltage.

9. A memory unit according to claim 7, wherein the memory unit does not include a transistor electrically between the bit line and the source line.

10. A memory unit according to claim 7, wherein the first diode provides current to the magnetic tunnel junction data cell to switch the magnetic tunnel junction data cell from a high resistance state to a low resistance state and the second diode provides current to the magnetic tunnel junction data cell to switch the magnetic tunnel junction data cell from a low resistance state to a high resistance state.

11. A memory unit according to claim 7, wherein the magnetic tunnel junction data cell is a spin-transfer torque data cell.

12. A memory unit according to claim 7, wherein the first diode is a p-n junction and the second diode is a p-n junction.

13. A method comprising:
- precharging an array of magnetic tunnel junction data cells to a specified precharge voltage level in a range from 40 to 60% of a write voltage, each magnetic tunnel junction data cell includes a first diode and a second diode in parallel electrical connection and having opposing forward bias directions, the precharge voltage being less than a threshold voltage of the first diode and second diode;
- switching a magnetic tunnel junction data cell from a high resistance state to a low resistance state by passing a write current through a selected magnetic tunnel junction data cell in a first direction, the write current provided by a first diode being electrically coupled to the magnetic tunnel junction data cell and a source line; and
- switching the selected magnetic tunnel junction data cell from a low resistance state to a high resistance state by passing a write current through the magnetic tunnel junction data cell in a second direction opposing the first direction, the write current provided by a second diode being electrically coupled to the magnetic tunnel junction data cell and a source line and in parallel electrical connection with the first diode.

14. A method according to claim 13, wherein the write current provided by a first diode is substantially the same magnitude as the write current provided by a second diode.

15. A method according to claim 13, further comprising precharging a plurality of bit lines and a plurality of source lines to a precharge voltage being less than a threshold voltage of the first diode and second diode, the plurality source lines intersecting with the plurality of bit lines and forming the cross-point array, and the magnetic tunnel junction data cell adjacent to at least selected cross-points of the cross-point array, the first diode and second diode are electrically between the magnetic tunnel junction data cell and the source line.

16. A method according to claim 15, further comprising writing a first data state to one or more magnetic tunnel junction data cells along a selected bit line by applying a write voltage to the selected bit line and grounding one or more selected source lines.

17. A method according to claim 15, further comprising reading a data state from a selected magnetic tunnel junction data cell by applying a read voltage to a selected bit line and grounding a selected source line.

18. A method according to claim 15, further comprising reading a data state from a selected magnetic tunnel junction data cell by applying a read voltage to a selected source line and grounding a selected bit line.

19. A method according to claim 15, wherein the precharge voltage is about 50% of the writing voltage.

20. A method according to claim 16, further comprising writing a second data state to one or more magnetic tunnel junction data cells along the selected bit line by applying a write voltage to the selected bit line and grounding one more selected source lines.

* * * * *